(12) United States Patent
Cook et al.

(10) Patent No.: US 6,616,256 B1
(45) Date of Patent: Sep. 9, 2003

(54) SERIAL INTEGRATED SCAN-BASED TESTING OF INK JET PRINT HEAD

(75) Inventors: William Paul Cook, Lexington, KY (US); John Glenn Edelen, Versailles, KY (US); George Keith Parish, Winchester, KY (US); Kristi Maggard Rowe, Lexington, KY (US); Susan Marie Zearfoss, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/106,746

(22) Filed: Mar. 26, 2002

(51) Int. Cl.[7] .................. B41J 29/38; B41J 29/393; G01R 31/28
(52) U.S. Cl. ............... 347/9; 347/19; 714/726
(58) Field of Search ................ 347/9, 59, 19; 714/726

(56) References Cited

U.S. PATENT DOCUMENTS

| | | | |
|---|---|---|---|
| 5,477,493 A | 12/1995 | Danbayashi | 365/201 |
| 5,504,507 A | 4/1996 | Watrobjuk et al. | 347/19 |
| 5,546,112 A | 8/1996 | Hunter et al. | 347/171 |
| 5,815,179 A | 9/1998 | Silverbrook | 347/59 |
| 5,907,562 A | 5/1999 | Wrape et al. | 371/22.31 |
| 5,940,095 A | 8/1999 | Parish et al. | 347/19 |
| 5,960,008 A | 9/1999 | Osawa et al. | 371/22.31 |
| 6,022,094 A | 2/2000 | Gibson et al. | 347/19 |
| 6,390,589 B1 * | 5/2002 | Imanaka et al. | 347/19 |

* cited by examiner

Primary Examiner—Hai Pham
Assistant Examiner—Alfred E. Dudding
(74) Attorney, Agent, or Firm—Luededa, Neely & Graham, PC

(57) ABSTRACT

An n-bit serial shift register in an ink jet print head operates in a print mode or a test mode. When the shift register is operating in the print mode, n bits of print data are serially scanned into n number of bit registers and are then latched out to heater addressing logic circuitry in the print head to control a print operation. When the circuit is operating in the test mode, x bits of test point data from x number of test nodes in the print head are loaded in parallel into x number of the n number of bit registers, and are then serially scanned out to a test data output. In this manner, a single shift register may be used to scan in print data and scan out test data, thereby providing observability and controllability of the internal logic nodes of the print head while minimizing logic size and the number of input/output connections on the print head.

19 Claims, 11 Drawing Sheets

SERIAL INTEGRATED SCAN-BASED TESTING OF INK JET PRINT HEAD

FIELD OF THE INVENTION

The present invention is generally directed to an apparatus and method for testing logic circuitry on an ink jet print head. More particularly, the invention is directed to testing an ink jet print head using a serial integrated scan-based test technique.

BACKGROUND OF THE INVENTION

As with most integrated circuitry, the testability of ink jet heater chips is essential to gaining a better understanding of the design and process issues that lead to poor yield and high die costs. As the number if ink-ejecting nozzles per heater chip increases, logic circuits on the heater chip become more and more complex. As the amount and complexity of on-chip logic increases, so does the potential for faults. To identify and eliminate these faults, structured test methodologies are needed that provide controllability and observability of internal circuit nodes while not adding significant additional amounts of costly test logic circuitry to the chip. Generally, controllability is the ability to set and reset every internal node of an integrated circuit. Observability is the ability to observe, either directly or indirectly, the state of any internal circuit node.

What is needed is an ink jet print head heater chip which provides improved observability and controllability of its internal logic nodes, and testing techniques to take advantage of such observability and controllability.

SUMMARY OF THE INVENTION

The foregoing and other needs are met by an ink jet print head integrated circuit that receives print data related to an image to be printed, and receives test point data for testing internal logic nodes of the circuit. The circuit includes x number of switching devices, each having a serial input, a test point input, and a switch output. The switch output is coupled to the serial input when the switching device is in a first state, and coupled to the test point input when the switching device is in a second state. The circuit also includes n number of bit registers, each having a data input and a data output. The data input of x number of the bit registers is coupled to the switch output of a corresponding one of the x number of switching devices. The circuit includes a serial print data input for receiving a serial string of bits of the print data. The circuit further includes x number of test points coupled to the test point inputs of the x number of switching devices. The x number of test points are for receiving x number of parallel bits of the test point data. A test data output for outputting a serial string of bits of the x number of bits of the test point data is coupled to the data output of an nth of the n number of bit registers. Preferably, x is less than or equal to n.

Thus, the circuit comprises an n-bit shift register which operates in a print mode or a test mode. When the circuit is operating in the print mode, n bits of print data are serially scanned into the n bit registers and are then latched out to heater addressing logic circuitry in the print head to control a print operation. When the circuit is operating in the test mode, x bits of test point data from x test nodes in the print head are loaded in parallel into x number of the n bit registers and are then serially scanned out to the test data output. In this manner, a single shift register may be used to scan in print data and scan out test data, thereby providing observability and controllability of the internal logic nodes of the print head while minimizing the logic size and the number of input/output connections on the print head.

In another aspect, the invention provides an ink jet print head integrated circuit for receiving print data related to an image to be printed, and for receiving test point data for testing internal logic nodes of the circuit. The circuit includes a shift register having a serial print data input for receiving bits of the print data in a serial string, and a plurality of parallel print data outputs for outputting the bits of print data in parallel. The circuit also includes a plurality of parallel test point inputs for receiving bits of the test point data in parallel, and a serial test data output for outputting a serial string of the bits of the test point data. The circuit further includes a plurality of latch circuits, each having a latch input coupled to a corresponding one of the parallel print data outputs.

In yet another aspect, the invention provides a method for operating on print data related to an image to be printed by an ink jet print head, and for operating on test point data to determine whether faults exist in internal logic nodes of the ink jet print head. The method includes the following steps: (a) receiving bits of the test point data at test point inputs of a shift register in the print head; (b) shifting the bits of the test point data through the shift register; (c) outputting the bits of the test point data from a serial output of the shift register; (d) receiving a serial string of bits of the print data at a serial input of the shift register; (e) shifting the bits of the print data through the shift register; and (f) latching the bits of the print data from parallel outputs of the shift register.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE INVENTION

Generally, an ink jet print head prints an image on a print medium by ejecting ink from an array of nozzles as the print head scans across the print medium. Ink is ejected from selected nozzles based on electrical pulses provided to resistive heating elements in a heater chip adjacent the nozzles. The electrical pulses cause the heating elements to generate and transfer heat into the adjacent ink, thereby causing the ink to nucleate and form a bubble which pushes ink out of the nozzle.

Which heating elements are pulsed at any given instant may be determined by a serial string of print data which may include address or group data bits and primitive data bits. The serial print data is provided to an integrated circuit on the heater chip which includes digital decode and logic devices. Based on the sequence of bits in the print data string, the integrated circuit determines which nozzles are activated.

Figure 1:
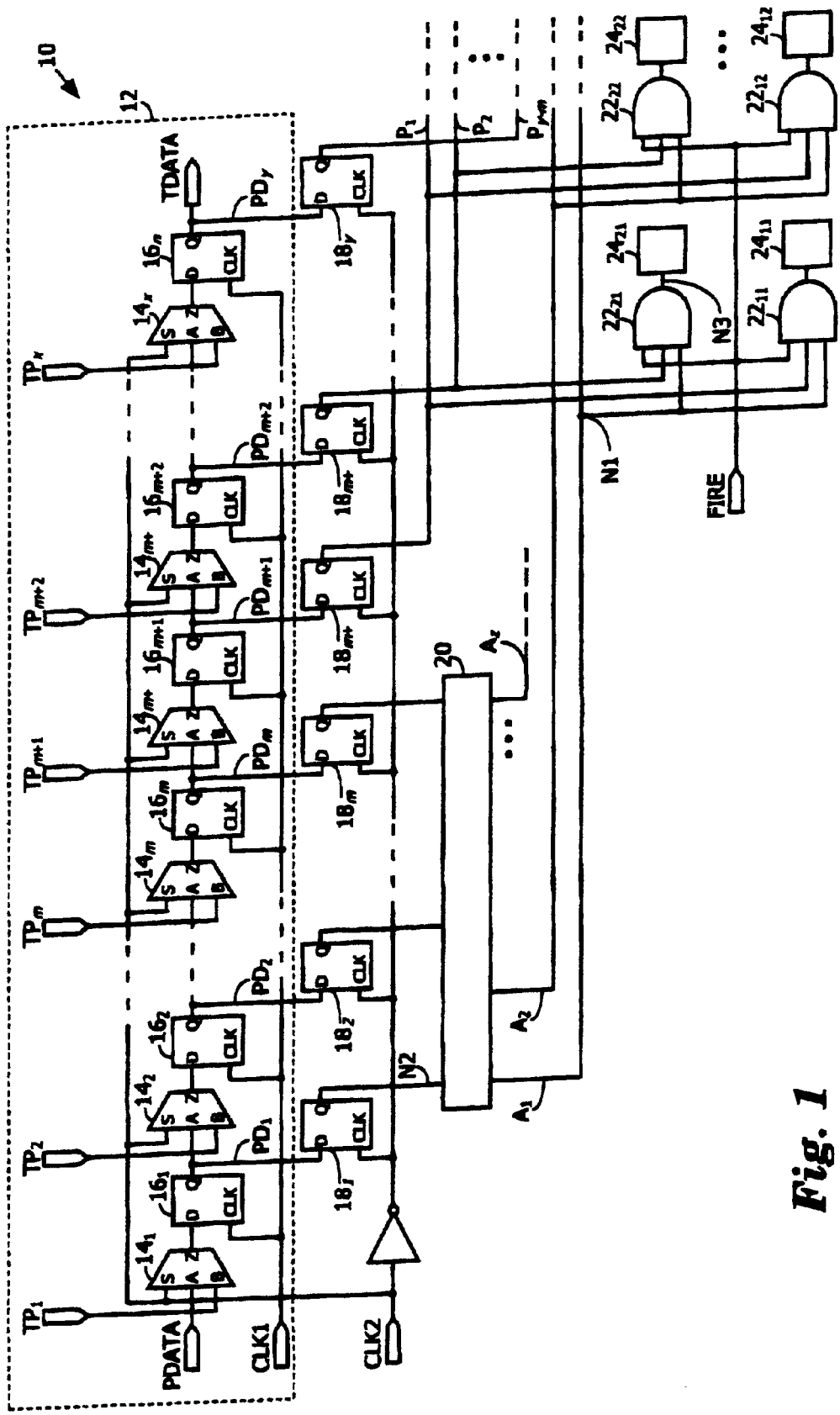
FIG. 1 is a schematic diagram of a print head circuit for inputting print data and outputting test point data according to a preferred embodiment of the invention.

Depicted in FIG. 1 is a preferred embodiment of such an integrated circuit 10 on an ink jet heater chip. The circuit 10 includes a shift register 12 having a serial sequence of alternating multiplexers $14_1$–$14_x$ and bit registers $16_1$–$16_n$, where n is the number of bits in the shift register 12, and where x is a number of logic test points to be monitored. Generally, n is determined by the number of bits in the string of serial print data, which could be any number, and x is determined by the number of test points, which also could be any number, Thus, the invention as described herein is not limited to any particular number of bits in the shift register 12 or any particular number of test points. The shift register 12 preferably has a print data serial input PDATA, a test data serial output TDATA, x number of parallel test point inputs $TP_1$–$TP_x$, and y number of print data parallel outputs $PD_1$–$PD_y$. Preferably, x and y are less than or equal to n.

In a preferred embodiment of the invention, the print data serial input PDATA is coupled to an application-specific integrated circuit (ASIC), also referred to herein as a printer controller, in an ink jet printer which provides the n-bit strings of serial print data to the PDATA input. The test point inputs $TP_1$–$TP_x$ are preferably coupled to logic nodes within the circuit 10 that are to be tested. For example, the test point $TP_1$ may be connected to node N1, which corresponds to bit output $A_1$ from a decode circuit 20. Alternatively, the test point $TP_1$ may be connected to node N2, which corresponds to the output of a latch $18_1$, or to node N3, which is within heater selection logic. Preferably, any of the test points $TP_1$–$TP_x$ may be coupled to any logic node within the circuit 10.

The bit registers $16_1$–$16_n$ of the shift register 12, which are preferably falling-edge-triggered D flip-flops, each have a data input D, a data output Q, and a clock input CLK. In the preferred embodiment, the clock input CLK of each of the bit registers $16_1$–$16_n$ is coupled to a first clock input CLK1 at which a first clock signal is provided. Preferably, a data bit at the data input D is provided to the data output Q when the first clock signal goes high. As shown in FIG. 1, the data outputs Q of the bit registers $16_1$–$16_n$ are coupled to the corresponding print data outputs $PD_1$–$PD_n$ of the shift register 12.

The multiplexers $14_1$–$14_x$, also referred to herein as switching devices, each have a serial input A, a parallel input B, a switch clock input S, and an output Z. When the multiplexers $14_1$–$14_x$ are in a first state, data at the serial input A is coupled to the output Z. When the multiplexers $14_1$–$14_x$ are in a second state, data at the parallel input B is coupled to the output Z. Whether the multiplexers $14_1$–$14_x$ are in the first or second states is determined by a signal referred to herein as a second clock signal. The second clock signal is preferably provided at a clock input CLK2 which is coupled to the switch input S of each of the multiplexers $14_1$–$14_x$.

As shown in the preferred embodiment of FIG. 1, the serial input A of the first multiplexer $14_1$ receives serial print data from the print data serial input PDATA. When the multiplexer $14_1$ is in the first state (also referred to herein as the 'WRITE' mode), the serial print data at the input A is coupled to the output Z, and is provided to the data input D of the bit register $16_1$. On the falling edge of the first clock signal connected to the clock input CLK of the register $16_1$, the data at the data input D of the register $16_1$ is latched to the data output Q of the bit register $16_1$ and to the serial input A of the next multiplexer $14_2$. In this manner, when the multiplexers $14_1$–$14_x$ are in the first state or WRITE mode, data may be shifted or "scanned" through the shift register 12.

In the preferred embodiment, the parallel input B of each of the multiplexers $14_1$$14_x$ is coupled to a corresponding one of the test point parallel inputs $TP_1$–$TP_x$. When the multiplexers $14_1$–$14_x$ are in the second state (also referred to herein as the 'READ' mode), test point bits at the inputs B are coupled to the outputs Z, and are provided to the data inputs D of adjacent bit registers $16_1$–$16_n$. In this manner, when the multiplexers $14_1$–$14_x$ are in the second state or READ mode, parallel data at the inputs $TP_1$–$TP_x$ may be read into the shift register 12.

As depicted in FIG. 1, the print data outputs $PD_1$–$PD_n$ of the shift register 12 are coupled to data inputs D of y number of corresponding latches $18_1$–$18_y$. When the second clock signal on the clock input CLK2 goes high, data bits present at the data inputs D are latched to the data outputs Q of the latches $18_1$–$8_y$.

In the preferred embodiment of FIG. 1, the data outputs Q of m number of the y number of latches $18_1$–$18_m$ are coupled to a decoder circuit 20. The decoder 20 decodes the m data bits at the outputs Q of the latches $18_1$–$18_m$ onto z number of nozzle address lines $A_1$–$A_z$, where z equals $2^m$. For example, if m is six, the data at the outputs Q of the latches $18_1$–$18_m$ may be decoded and provided to sixty-four ($2^6$) nozzle address lines $A_1$–$A_{64}$. One skilled in the art will appreciate that many other decoding combinations are possible. For example, the data bits at the outputs Q of two of the latches, such as $18_1$ and $18_2$, may be decoded into four extended address bits on the lines $A_1$–$A_4$, and the other four data bits at the outputs Q of the latches $18_3$–$18_6$ may be decoded into sixteen address bits on the lines $A_5$–$A_{20}$.

As shown in FIG. 1, the data outputs Q of the latches $18_{m+1}$–$18_y$ are preferably coupled to y–m number of primitive lines $P_1$–$P_{y-m}$. In a most preferred embodiment of the invention, there are sixteen primitive lines $P_1$–$P_{16}$ (y–m= 16), such that up to sixteen nozzles may be activated simultaneously. However, it should be appreciated that the invention is not limited to any particular number of primitive lines.

In the preferred embodiment, the address lines $A_1$ and $A_2$ and the primitive lines $P_1$ and $P_2$ are coupled to inputs of AND logic circuits $22_{11}$, $22_{12}$, and $22_{21}$, $22_{22}$, as depicted in FIG. 1. A fire pulse signal provided on a FIRE line is also coupled to the inputs of each of the AND logic circuits $22_{11}$, $22_{12}$, $22_{21}$, and $22_{22}$. The output of each of the AND logic circuits $22_{11}$, $22_{12}$, $22_{21}$, and $22_{22}$ is coupled to a corresponding heating element driver circuit $24_{11}$, $24_{12}$, $24_{21}$, and $24_{22}$ for activating an associated heating element. Thus, signals on the address lines and primitive lines are used to "select" particular heating elements to be activated, and the pulse on the FIRE line activates the selected heating elements. For example, if signals on the address line $A_1$ and the primitive line $P_1$ are high simultaneously, the driver circuit $24_{11}$ is activated when the FIRE line is pulsed. So as to not overly complicate FIG. 1, only four AND logic circuits and driver circuits are depicted. However, as one skilled in the art will appreciate, the circuit 10 may include up to z times y–m number of AND logic circuits and driver circuits for selecting and activating up to z times y–m number of heating elements.

Figure 2:
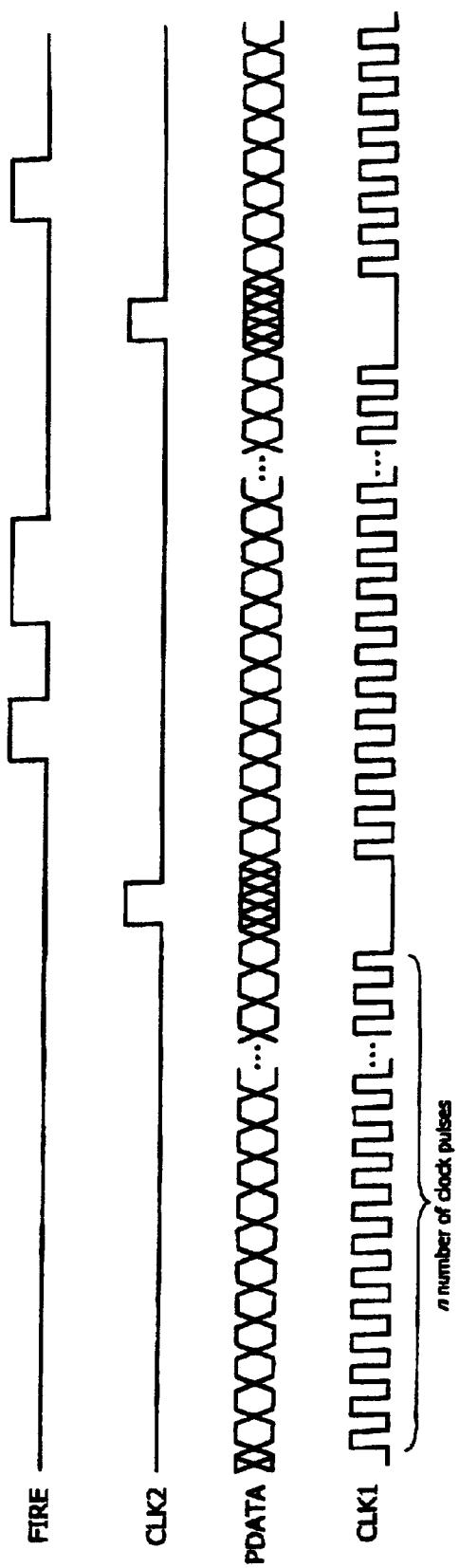
FIG. 2 depicts a print mode timing diagram according to a preferred embodiment of the invention.
Figure 3:
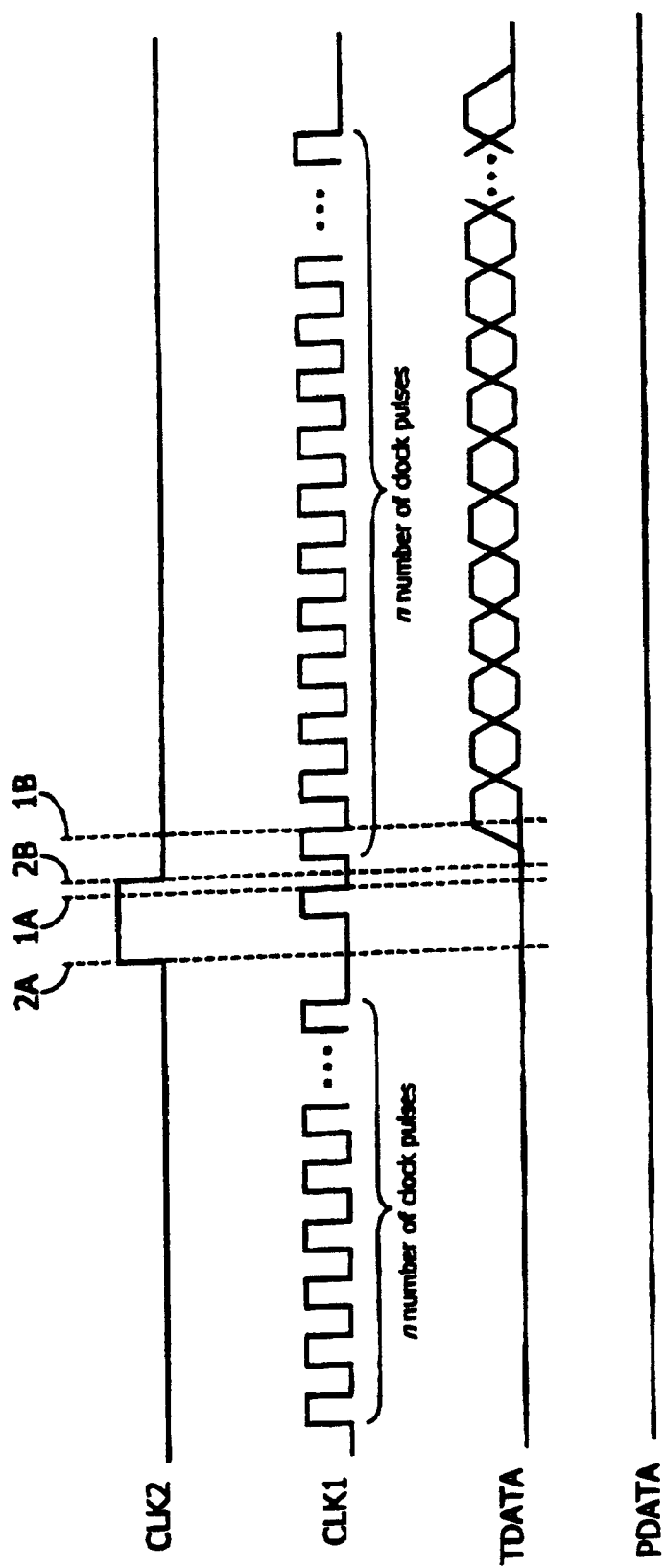
FIG. 3 depicts a test mode timing diagram according to a preferred embodiment of the invention.
Figure 4:
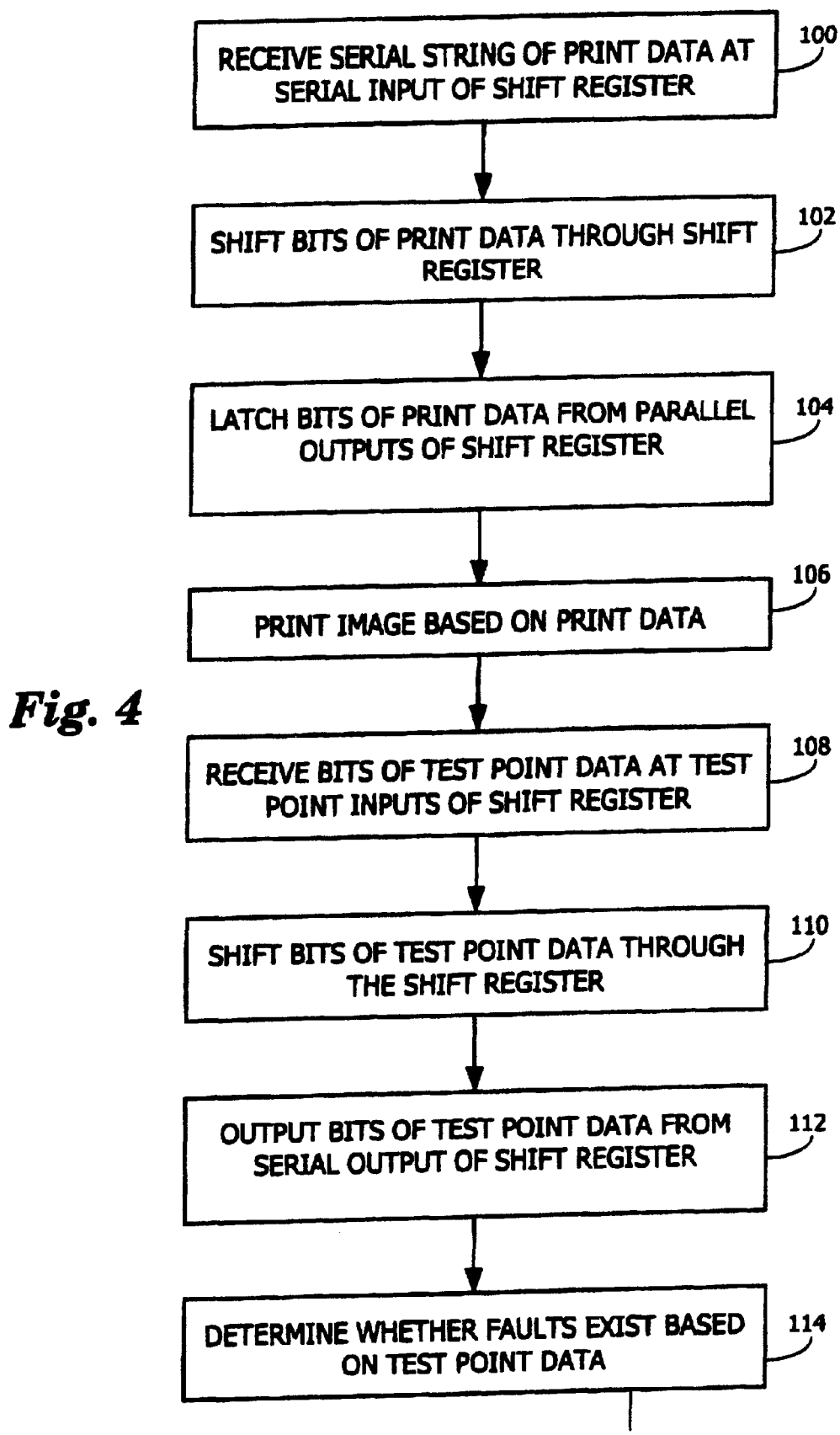
FIG. 4 depicts a method for operating on print data and test data according to a preferred embodiment of the invention.

FIGS. 2 and 3 depict timing diagrams for the operation of the circuit 10 in a normal print mode and in a test mode, respectively, and FIG. 4 depicts a method for operating the circuit 10 in the test and print modes. As shown in FIGS. 2 and 4, in the normal print mode, serial print data is received on the line PDATA and is shifted bit-by-bit into the shift register 12 (FIG. 1) with each pulse of the first clock signal on the first clock line CLK1 (steps 100 and 102 in FIG. 4). Note that as the print data is shifted into the register 12, the second clock signal on the line CLK2 remains low, thereby coupling the serial inputs A to the outputs Z of each of the multiplexers $14_1$–$14_x$. After n bits of print data have been shifted into the register 12, the second clock signal on the line CLK2 goes high, thereby latching the print data bits in the bit registers $16_1$–$16_n$ into the corresponding latches $18_1$–$18_y$ (step 104). Based on the latched bits, particular heating elements are selected, as discussed above. The second clock signal on the line CLK2 then goes low so that the next string of n bits may be shifted into the shift register 12. The selected heating elements are then activated by the pulses on the FIRE line. This process repeats over and over as the print head scans across the print medium to print the image (step 106). Note that in the normal print mode, the first and second clock signals are never high at the same time.

FIGS. 3 and 4 depict operation in the test mode, where, as in the normal print mode, the bit registers $16_1$–$16_n$ are triggered by the falling edge of pulses on the clock line CLK1 and the latches $18_1$–$8_y$ are triggered by the rising edges of pulses on the clock line CLK2. At time 2A, the second clock signal on the line CLK2 goes high, thereby coupling the parallel inputs B to the outputs Z of the multiplexers $14_1$–$14_x$, which provides the x number of test point bits on the parallel test point input lines $TP_1$–$TP_x$ to the data inputs of the corresponding bit registers $16_1$–$16_n$ (step 108). At time 1A, the first clock signal on the line CLK1 goes low, thereby shifting the test point bits from the data inputs D to the data outputs Q of the bit registers $16_1$–$16_n$.

At time 2B, the second clock signal on the line CLK2 goes low, thereby coupling the serial inputs A to the outputs Z of the multiplexers $14_1$–$14_x$. At time 1B, the first clock signal on the line CLK1 again goes low, thereby shifting the test point bits in the shift register 12 by one bit position to the right. Thus, at time 1B, the test point bit in the bit register $16_n$ is shifted out to the serial test data output TDATA. The remaining test point bits are shifted through the shift register 12 (step 110) and out to the serial test data output TDATA by the subsequent n–1 number of clock pulses on the line CLK1 (step 112). Based on the test point bits, a determination is then made whether faults exist on the tested circuit nodes (step 114).

Tables I and II depict four examples of how the invention may be used to detect fault conditions in an ink jet heater chip. In these examples, n, x, and y are eight and m is six, such that there are six address or group data bits and two primitive data bits shifted into eight bit registers $16_1$–$16_x$ of the shift register 12. In the examples of Tables I and II, the test points $TP_1$ and $TP_2$ are connected to the outputs $A_1$ and $A_2$ of the decoder 20. The other test points $TP_3$–$TP_8$ are not connected to any circuit node in these examples.

TABLE I

| | Input Bit Pattern | | | | | | | | Decode | | Test Output Pattern | | | | | | | |
|---|---|---|---|---|---|---|---|---|---|---|---|---|---|---|---|---|---|---|
| Condition | $16_8$ | $16_7$ | $16_6$ | $16_5$ | $16_4$ | $16_3$ | $16_2$ | $16_1$ | $A_2$ | $A_1$ | $TP_8$ | $TP_7$ | $TP_6$ | $TP_5$ | $TP_4$ | $TP_3$ | $TP_2$ | $TP_1$ |
| Correct operation | 0 | 0 | 0 | 0 | 0 | 0 | 0 | 1 | 1 | 0 | — | — | — | — | — | — | 1 | 0 |
| $A_2$ stuck low | 0 | 0 | 0 | 0 | 0 | 0 | 0 | 1 | 0 | 0 | — | — | — | — | — | — | 0 | 0 |
| $A_1$ stuck high | 0 | 0 | 0 | 0 | 0 | 0 | 0 | 1 | 1 | 1 | — | — | — | — | — | — | 1 | 1 |

TABLE II

| | Input Bit Pattern | | | | | | | | Decode | | Test Output Pattern | | | | | | | |
|---|---|---|---|---|---|---|---|---|---|---|---|---|---|---|---|---|---|---|
| Condition | $16_8$ | $16_7$ | $16_6$ | $16_5$ | $16_4$ | $16_3$ | $16_2$ | $16_1$ | $A_2$ | $A_1$ | $TP_8$ | $TP_7$ | $TP_6$ | $TP_5$ | $TP_4$ | $TP_3$ | $TP_2$ | $TP_1$ |
| Correct operation | 0 | 0 | 0 | 0 | 0 | 0 | 0 | 0 | 0 | 1 | — | — | — | — | — | — | 0 | 1 |
| $A_1$ stuck low | 0 | 0 | 0 | 0 | 0 | 0 | 0 | 0 | 0 | 0 | — | — | — | — | — | — | 0 | 0 |
| $A_2$ stuck high | 0 | 0 | 0 | 0 | 0 | 0 | 0 | 0 | 1 | 1 | — | — | — | — | — | — | 1 | 1 |

From left to right, each row of Tables I and II includes an input bit pattern that is shifted into the shift register 12, the resulting decode bits on the outputs $A_1$ and $A_2$ of the decoder 20, and the corresponding test output pattern that is shifted out on the test data output TDATA. In the input bit pattern of these examples, bit register $16_1$ holds the least significant bit and bit register $16_6$ holds the most significant bit of the group (address) data. Bit register $16_7$ holds the least significant bit and bit register $16_8$ holds the most significant bit of the primitive data.

The first row of Tables I and II indicates a correct operation condition, that is, a condition wherein there are no faults at the outputs $A_1$ and $A_2$. The second row of Table I depicts a bit-stuck-low condition at the decode output $A_2$, and the third row of Table I depicts a bit-stuck-high condition at the decode output $A_1$. The second row of Table II depicts a bit-stuck-low condition at the decode output $A_1$, and the third row of Table II depicts a bit-stuck-high condition at the decode output $A_2$.

Thus, in the example of Table I, when a bit is stuck low on the decode output $A_2$, the low bit appears at the test point $TP_2$ which is shifted out in the test output pattern. When the test output pattern is compared to a predetermined 'correct' output pattern, an error signal is generated indicating a stuck low bit at the output $A_2$. This comparison preferably is performed in the printer controller, such as using comparator logic. However, it may also be performed in the host computer to which the printer is connected.

Figure 5:
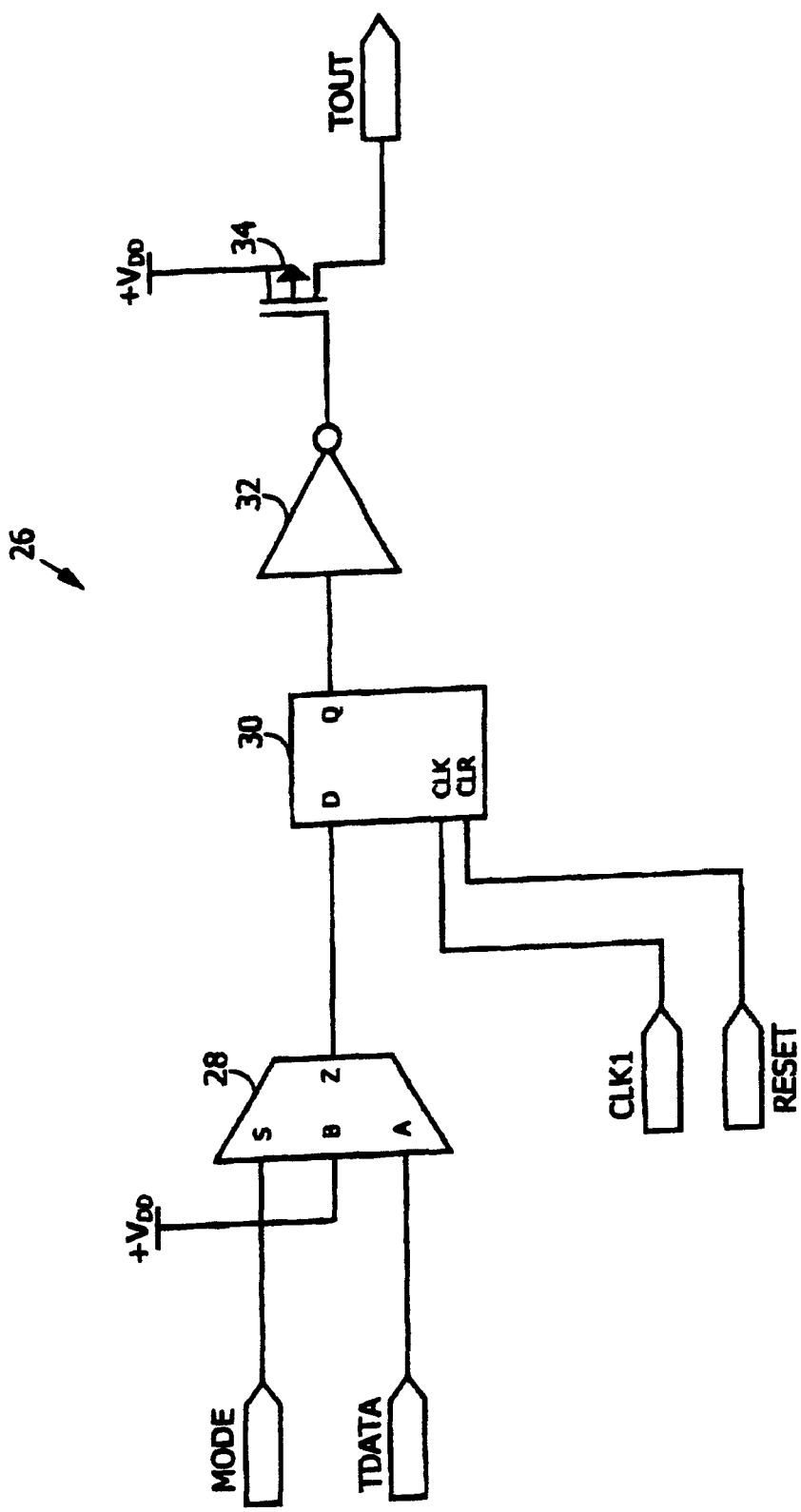
FIG. 5 depicts a test data output circuit according to a preferred embodiment of the invention.

Depicted in FIG. 5 is a test data output driver circuit 26 used in preferred embodiments of the invention. The driver circuit 26 includes a multiplexer 28 having an input A coupled to the test data serial output TDATA, and an input B coupled to a pull-up voltage $+V_{DD}$. Based on the state of a mode select input MODE which is coupled to a switch input S, the multiplexer 28 couples either input A or input B to a switch output Z. Preferably, when the MODE input is high, serial test data from the TDATA line is latched to the data input D of a flip-flop 30, clocked to the data output Q of the flip-flop 30 based on clock pulses on the line CLK1, and provided through the buffer 32 and an open-drain PMOS. FET pull-up device 34 to a test data output line TOUT. When the MODE line is low, the pull-up voltage $+V_{DD}$ is coupled through the flip-flop 30 and the buffer 32 to the PMOS device 34, thereby pulling the voltage on the test data output line TOUT up to the $+V_{DD}$ voltage level.

This preferred implementation of the driver circuit 26 allows multiple test data outputs TDATA from multiple shift registers 12 on a single chip or multiple chips, to be tied together on the TOUT line, connected to a single pull-down resistor, and provided as a single test data output for the printer ASIC. With this embodiment, the test data output on the TDATA line is preferably 'turned on' only when the MODE line is high, and is otherwise held low. In this manner, only the test data from the shift register 12 under test toggles the single test input of the printer ASIC. While the output driver as depicted in FIG. 5 is preferred, it should be appreciated that any type of output driver could be used, such as output buffers, open drain NMOS pull-down devices, etc.

The present invention provides several advantages over prior test techniques. First, since there is only one test data output per shift register, test input/output is minimized. Second, the use of redundant output shift register logic is avoided, thereby reducing silicon size and avoiding the introduction of more potential faults. By using a single shift register for both print data input and test data output functions, this technique adds only one multiplexer per bit register for loading the test data.

As one skilled in the art will appreciate, a critical balance exists between the amount of logic circuitry to add for providing testability versus the benefit provided by such added circuitry. The addition of testability circuits typically increases the number of input/output connections on the heater chip, the chip area, and the signal propagation delay. Thus, tradeoffs exist in the amount of input/output, the number of circuit nodes to test, and the test time required. The use of the shift register 12 of the present invention instead of multiple additional input/output pins advantageously addresses these issues. In the preferred embodiment, only enough logic and input/output is added to specifically observe the logic nodes that drive the heater element addressing (i.e., group, primitive, control data after latching, and decoded address data). Thus, the increase in chip area necessary to provide this observability is minimal.

The present invention provides for the testability of as many internal nodes as there are shift register bits, and the test results are accessible through a single input/output line. In this manner, the invention provides more information on where problems occur most frequently, thereby allowing for design adjustments to compensate for common problems. This results in heater chips of higher quality and lower cost.

Figure 6:
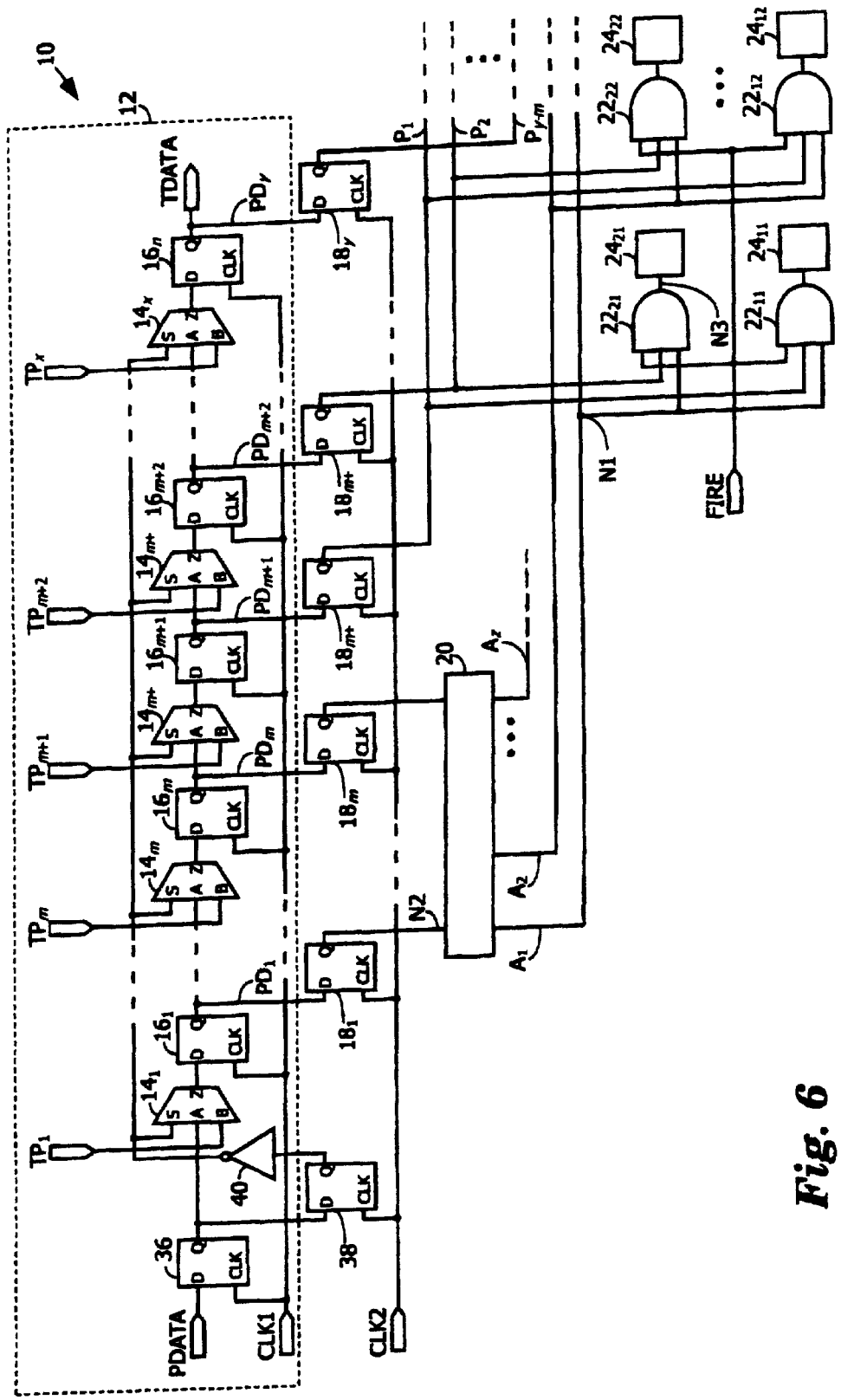
FIG. 6 is a schematic diagram of a print head circuit for inputting print data and outputting test point data according to an alternative embodiment of the invention.

Shown in FIG. 6 is an alternative embodiment of the invention wherein the READ/WRITE state of the shift register 12 is determined by a bit in the input print data stream rather than by a clock pulse on the clock input CLK2. As depicted in FIG. 6, the shift register 12 of this embodiment includes an extra bit register 36 which is referred to herein as a READ/WRITE bit register. The data output Q of the register 36 is coupled to the data input D of a latch 38. The data output Q of the latch 38 is coupled through a buffer circuit 40 to the switch inputs S of the multiplexers $14_1$–$14_x$. The rest of the structure of the circuit 10 depicted in FIG. 6 is preferably the same as shown in FIG. 1 and as described above.

Figure 7:
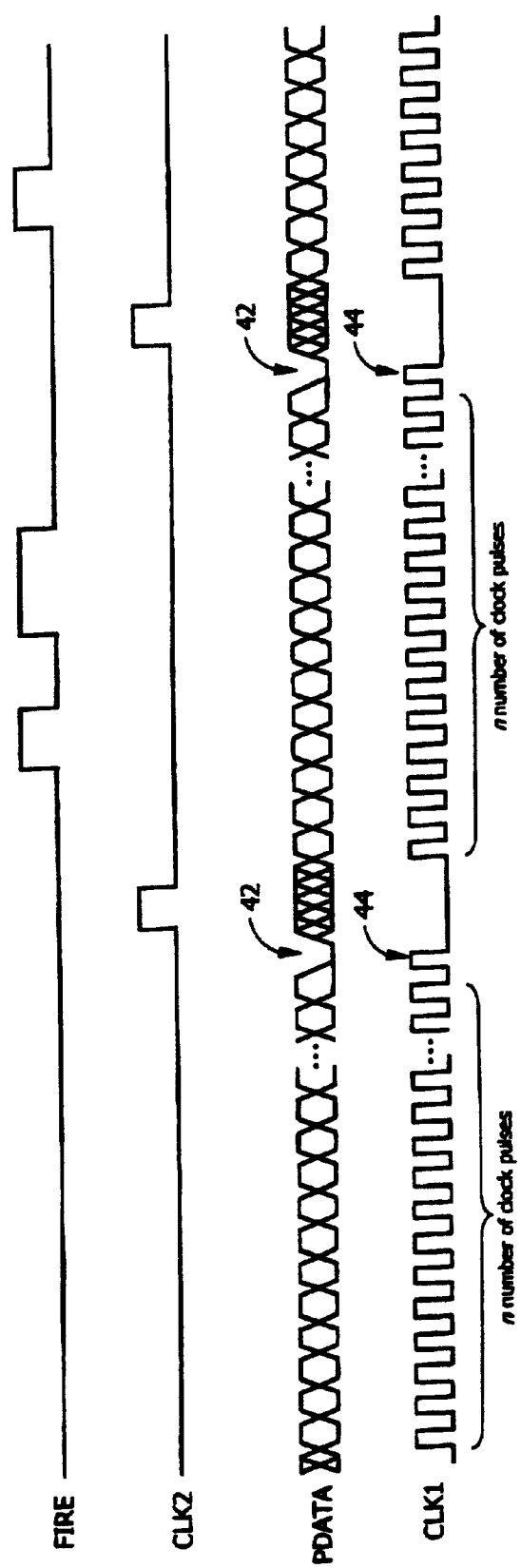
FIG. 7 depicts a print mode timing diagram according to an alternative embodiment of the invention.
Figure 8:
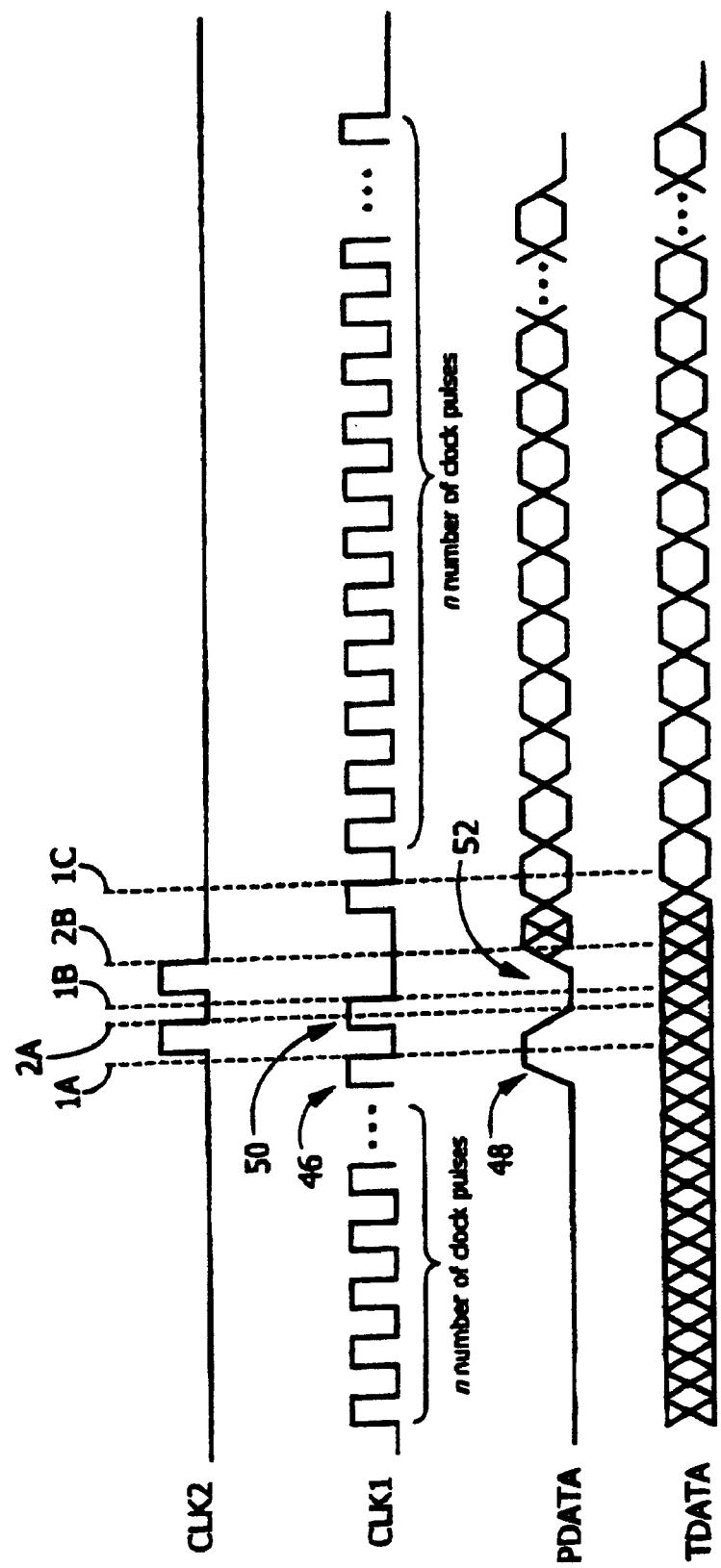
FIG. 8 depicts a test mode timing diagram according to an alternative embodiment of the invention.

FIGS. 7 and 8 depict timing diagrams for the operation of the circuit 10 of FIG. 6 in a normal print mode and in a test mode, respectively. As shown in FIG. 7, in the normal print mode, n+1 bits of serial print data on the line PDATA are shifted into the shift register 12 (FIG. 6) with each pulse of the first clock signal on the first clock line CLK1. The last of the n+1 bits of print data, also referred to herein as the READ/WRITE bit 42, is shifted into the register 36 on the falling edge of the clock pulse 44. Note that as the print data is shifted into the register 12, the second clock signal on the line CLK2 remains low. When the second clock signal goes low, the READ/WRITE bit 42 is latched to the output Q of the latch 38 which is coupled to the switch input S of the multiplexer $14_1$. Since the READ/WRITE bit 42 is low when the circuit 10 is operating in the normal print mode, the serial inputs A of each of the multiplexers $14_1$–$14_x$ remain coupled to their outputs Z. On the same falling edge of the second clock signal on the line CLK2, the print data bits in the bit registers $16_1$–$16_n$ are latched into the corresponding latches $18_1$–$18_y$, and based on the latched bits, particular heating elements are selected. The second clock signal on the line CLK2 then goes low, and the next string of n+1 bits are shifted into the shift register 12. The selected heating elements are then activated by the pulses on the FIRE line.

The timing diagram of FIG. 8 depicts operation of the circuit 10 of FIG. 6 in the test mode, where, as in the normal print mode, the bit registers $16_1$–$16_n$ are triggered by the falling edges of pulses on the clock line CLK1, and the latches $18_1$–$18_y$ are trigged by the falling edges of pulses on the clock line CLK2. At time 1A, corresponding to the falling edge of the pulse 46 of the first clock signal CLK1, the READ/WRITE bit 48 on the PDATA line is shifted into the bit register 36. At time 2A, corresponding to the falling edge of the second clock signal on the line CLK2, the READ/WRITE bit 48 is latched into the latch 38 and is coupled to the switch input S of the multiplexer $14_1$. Since the READ/WRITE bit 48 is high, the parallel inputs B of the multiplexers $14_1$–$14_x$ are coupled to their outputs Z. In this manner, the x number of test point bits at the parallel test point inputs $TP_1$–$TP_x$ are coupled to the data inputs D of the corresponding bit registers $16_1$–$16_n$. At time 1B, corresponding to the falling edge of the pulse 50 of the first clock signal CLK1, the test point bits are shifted from the data inputs D to the data outputs Q of the bit registers $16_1$–$16_n$, and the next READ/WRITE bit 52 on the PDATA line is shifted into the bit register 36. At time 2B, the second clock signal on the line CLK2 again goes low, thereby latching the READ/WRITE bit 52 into the latch 38. Since the READ/WRITE bit 52 is low, the serial inputs A of the multiplexers $14_1$–$14_x$ are coupled to their outputs Z. At time 1C, the first clock signal on the line CLK1 again goes low, thereby shifting the test point bits in the shift register 12 by one bit position to the right, which shifts the test point bit in the bit register $16_n$ out to the serial test data output TDATA. The remaining test point bits in the shift register 12 are shifted out to the serial test data output TDATA by the subsequent n−1 number of clock pulses on the line CLK1.

Figure 9:
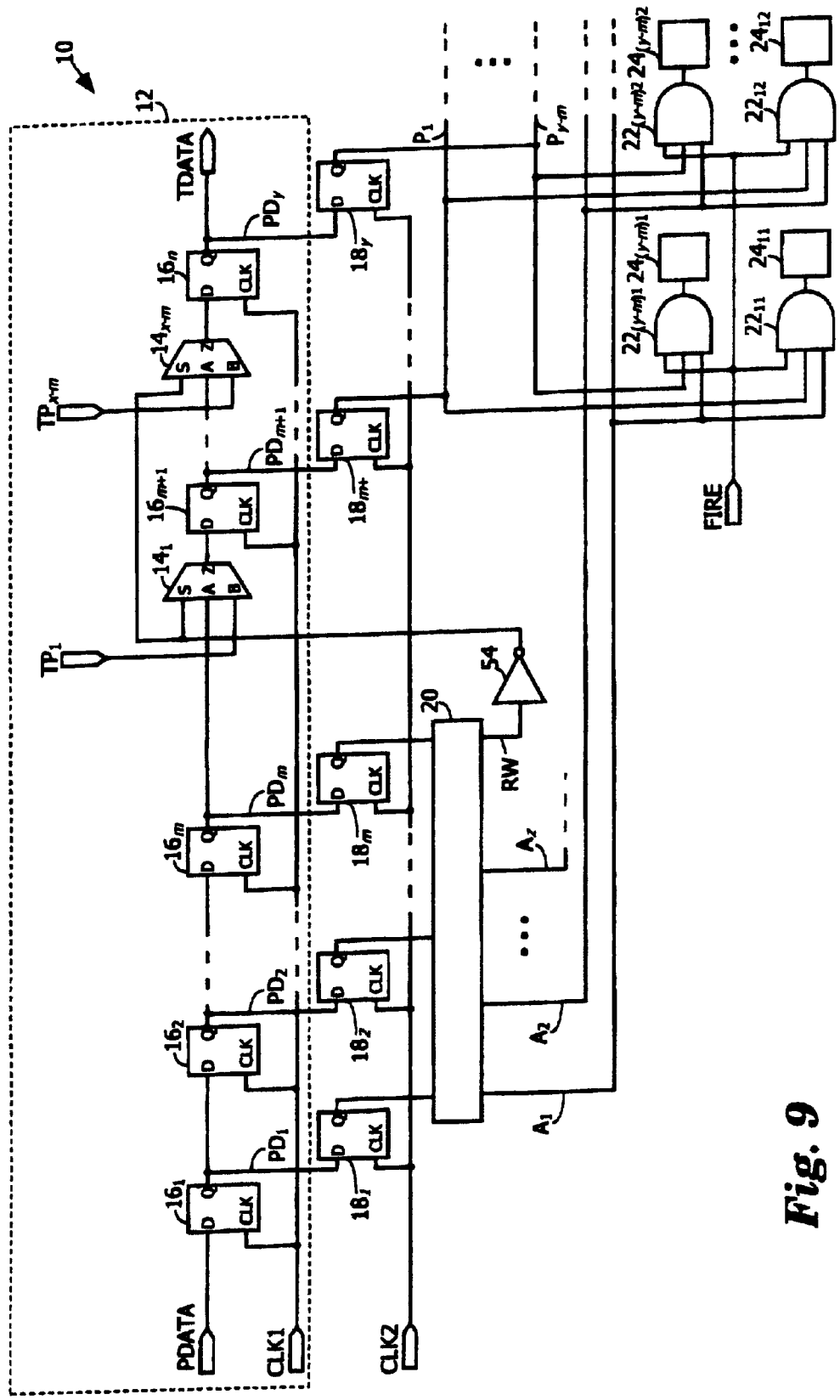
FIGS. 9, 10, and 11 are schematic diagrams of print head circuits for scanning in print data and scanning out test point data according to other alternative embodiments of the invention.

FIG. 9 depicts another alternative embodiment of the invention. In this embodiment, the READ/WRITE control signal is provided at an output RW of the decoder 20 and is fed to the multiplexers $14_1$–$14_{x-m}$ associated with the primitive bit registers $16_{m+}$–$16_n$. Note that in this embodiment, the group or address bit registers $16_1$–$16_m$ are preferably not used to read in test points, since these bits are decoded to provide the READ/WRITE control signal. The timing relationships for print and test modes for this embodiment are preferably the same as depicted in FIGS. 7 and 8.

Figure 10:
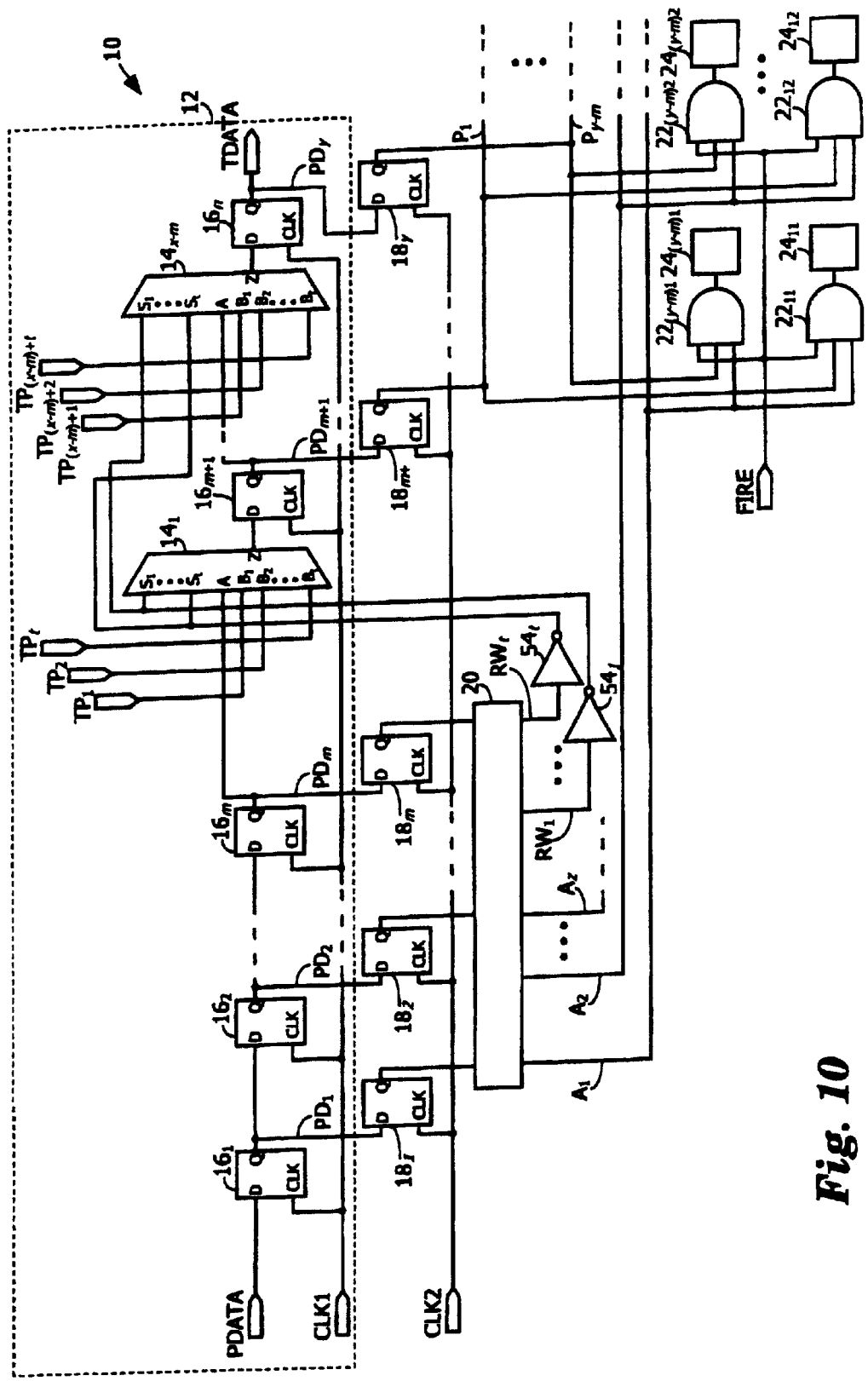

As depicted in FIG. 10, the embodiment of FIG. 9 may be extended to use the multiplexers $14_1$–$14_{x-m}$ to select from multiple test points. In the embodiment of FIG. 10, any one of t number of test points $TP_1$–$TP_t$ or $TP_{(x-m)+1}$–$TP_{(x-m)+t}$ may be selected based on the state of t number of READ/WRITE control signals at the output of the decoder 20. For example, a logic-high signal (READ) on the output $RW_1$ provided to the switch input $S_1$ of the multiplexer $14_1$ causes the output Z to be coupled to the input $B_1$ connected to the test point $TP_1$. Logic-low signals on all of the outputs $RW_1$–$RW_t$ indicates the WRITE condition, where the outputs Z are coupled to the serial inputs A of the multiplexers $14_1$–$14_{x-m}$.

Figure 11:
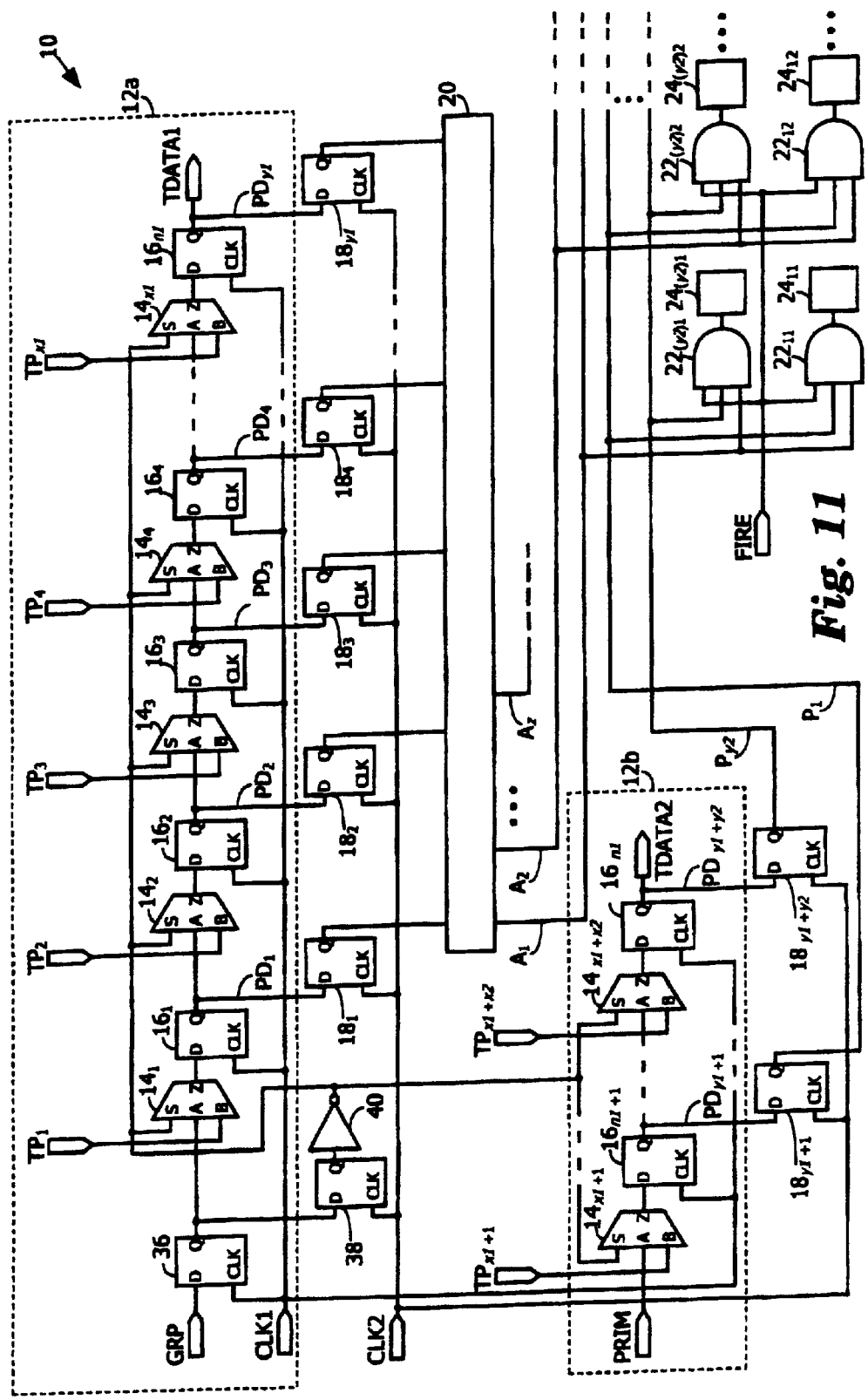

In another embodiment of the invention, print input data is written to and test points are read into multiple serial shift registers. For example, as depicted in FIG. 11, group print data is written to a serial data input GRP of a group serial shift register 12a, and primitive print data is written to a primitive data input PRIM of a primitive serial shift register 12b. Test points $TP_1$–$TP_{x1}$ are coupled to the shift register 12a and test points $TP_{x1+1}$–$TP_{x1+x2}$ are coupled to the shift register 12b. Test point data is shifted out of the register 12a at the test data output TDATA1, and test point data is shifted out of the register 12b at the test data output TDATA2. Preferably, print data is written into and latched out of the shift registers 12a and 12b using the same timing as depicted in FIG. 7, and test data is read into and shifted out of the shift registers 12a and 12b using the same timing as depicted in FIG. 8. Although the embodiment of FIG. 11 includes two test data outputs, TDATA1 and TDATA2, one skilled in the art will appreciate that the test data output strings could be combined, encoded, and shifted out to a single test output. One skilled in the art will also appreciate that the embodiment depicted in FIG. 11 could include any number of shift registers, and is not limited to two.

It is contemplated, and will be apparent to those skilled in the art from the preceding description and the accompanying drawings that modifications and/or changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. An ink jet print head integrated circuit for receiving print data related to an image to be printed, and for receiving test point data for testing internal logic nodes of the circuit, the circuit comprising:

x number of switching devices, each having:
   a serial input,
   a test point input, and
   a switch output coupled to the serial input when in a first state, and coupled to the test point input when in a second state;

n number of bit registers, each having a data input and a data output, the data input of x number of the bit registers coupled to the switch output of a corresponding one of the x number of switching devices;

a serial print data input for receiving a serial string of bits of the print data;

x number of test points coupled to the test point inputs of the x number of switching devices, the x number of test points for receiving x number of parallel bits of the test point data; and a test data output coupled to the data output of an nth of the n number of bit registers, the test data output for outputting a serial string of the x number of bits of the test point data, where x is less than or equal to n.

2. The ink jet print head integrated circuit of claim 1 wherein x equals n, the data outputs of n−1 of the n number of bit registers are coupled to the serial inputs of n−1 of the x number of switching devices, and the serial print data input is coupled to the serial input of a first of the x number of switching devices.

3. The ink jet print head integrated circuit of claim 1 further comprising:

the n number of bit registers each having a register clock input; and a first clock input coupled to the register clock input of each of the n number of bit registers, the first clock input for receiving a first clock signal for shifting the bits of print data or the bits of test point data through the n number of bit registers.

4. The ink jet print head integrated circuit of claim 1 further comprising:

the x number of switching devices each having a switch clock input; and a second clock input coupled to the switch clock input of each of the x number of bit switching devices, the second clock input for receiving a second clock signal for causing the x number of switching devices to switch between the first and second states.

5. The ink jet print head integrated circuit of claim 1 further comprising y number of latch circuits, where y is less than or equal to n, each of the latch circuits having:

a latch input coupled to the data output of one of the n number of bit registers; and a latch output.

6. The ink jet print head integrated circuit of claim 5 further comprising:

the y number of latch circuits each having a latch clock input; and a second clock input coupled to the latch clock input of each of the y number of latch circuits, the second clock input for receiving a second clock signal for causing the y number of latch circuits to latch bits of print data from the data outputs of y number of the bit registers.

7. The ink jet print head integrated circuit of claim 6 further comprising:

the x number of switching devices each having a switch clock input; and the second clock input coupled to the switch clock input of each of the x number of switching devices, the second clock input further for receiving the second clock signal for causing the x number of switching devices to switch between the first and second states.

8. An ink jet print head integrated circuit for receiving print data related to an image to be printed, and for receiving test point data for testing internal logic nodes of the circuit, the circuit comprising:

a shift register having:
   a serial print data input for receiving bits of the print data in a serial string;
   a plurality of parallel print data outputs for outputting the bits of print data in parallel;
   a plurality of test point inputs for receiving bits of the test point data in parallel; and
   a serial test data output for outputting a serial string of the bits of the test point data; and
a plurality of latch circuits, each having:
   a latch input coupled to a corresponding one of the parallel print data outputs; and
   a latch output.

9. The ink jet print head integrated circuit of claim 8 wherein the shift register further comprises:

x number of switching devices, each having:
   a serial input,
   a test data input, and
   a switch output coupled to the serial input when in a first state, and coupled to the test data input when in a second state; and
n number of bit registers, each having a data input and a data output, where the data input of x number of the bit registers is coupled to the switch output of a corresponding one of the x number of switching devices.

10. The ink jet print head integrated circuit of claim 9 further comprising the serial print data input coupled to the serial input of a first of the x number of switching devices.

11. The ink jet print head integrated circuit of claim 9 further comprising x number of test points coupled to the test data inputs of the x number of switching devices.

12. The ink jet print head integrated circuit of claim 9 further comprising the serial test data output coupled to the data output of an nth of the n number of bit registers.

13. The ink jet print head integrated circuit of claim 9 further comprising:

the n number of bit registers each having a register clock input; and
a first clock input coupled to the register clock input of each of the n number of bit registers, the first clock input for receiving a first clock signal for shifting the bits of print data or the bits of test point data through the n number of bit registers.

14. The ink jet print head integrated circuit of claim 9 further comprising:

the x number of switching devices each having a switch clock input; and
a second clock input coupled to the switch clock input of each of the x number of bit switching devices, the second clock input for receiving a second clock signal for causing the x number of switching devices to switch between the first and second states.

15. The ink jet print head integrated circuit of claim 9 further comprising:

y number of the latch circuits, each having a latch clock input; and
a second clock input coupled to the latch clock input of each of the y number of latch circuits, the second clock input for receiving a second clock signal for causing the y number of latch circuits to latch bits of print data from the data outputs of y number of the bit registers.

16. An ink jet print head integrated circuit for receiving print data related to an image to be printed, and for receiving test point data for testing internal logic nodes of the circuit, the circuit comprising:

x number of switching devices, each having:
   a serial input,
   a test point input,
   a switch clock input, and
   a switch output coupled to the serial input when in a first state, and coupled to the test point input when in a second state;
a serial print data input for receiving a serial string of bits of the print data;
x number of test points coupled to the test point inputs of the x number of switching devices, the x number of test points for receiving x number of parallel bits of the test point data;
n number of bit registers, each having a register clock input, a data input, and a data output, the data input of x number of the bit registers coupled to the switch output of a corresponding one of the x number of switching devices;
y number of latch circuits, each having:
   a latch clock input;
   a latch input coupled to the data output of one of the n number of bit registers; and
   a latch output;
a first clock input coupled to the register clock input of each of the n number of bit registers, the first clock input for receiving a first clock signal for shifting the bits of print data or the bits of test point data through the n number of bit registers;
a second clock input coupled to the switch clock input of each of the x number of switching devices and to the latch clock input of each of the y number of latch circuits, the second clock input for receiving a second clock signal for causing the x number of switching devices to switch between the first and second states, and for causing the y number of latch circuits to latch bits of print data from the data outputs of the n number of bit registers; and
a test data output coupled to the data output of an nth of the n number of bit registers, the test data output for outputting a serial string of the x number of bits of the test point data,
where x is less than or equal to n, and y is less than or equal to n.

17. An ink jet print head integrated circuit for receiving print data related to an image to be printed, and for receiving test point data for testing internal logic nodes of the circuit, the circuit comprising:

a shift register having:
   a serial print data input for receiving bits of the print data in a serial string;
   a plurality of parallel print data outputs for outputting the bits of print data in parallel;
   a plurality of parallel test point inputs for receiving bits of the test point data in parallel;
   a serial test data output for outputting a serial string of the bits of the test point data;

x number of switching devices, each having:
  a serial input,
  a test data input,
  a switch clock input, and
  a switch output coupled to the serial input when in a first state, and coupled to the test data input when in a second state;
the serial print data input coupled to the serial input of a first of the x number of switching devices;
x number of the test point inputs coupled to the test data inputs of the x number of switching devices;
n number of bit registers, each having a register clock input, a data input, and a data output, the data input of x number of the bit registers coupled to the switch output of a corresponding one of the x number of switching devices;
the serial test data output coupled to the data output of an nth of the n number of bit registers; and
y number of latch circuits, each having:
  a latch input coupled to a corresponding one of the parallel print data outputs;
  a latch output; and
  a latch clock input;
a first clock input coupled to the register clock input of each of the n number of bit registers, the first clock input for receiving a first clock signal for shifting the bits of print data or the bits of test point data through the n number of bit registers; and
a second clock input coupled to the switch clock input of each of the x number of switching devices, and coupled to the latch clock input of each of the y number of latch circuits, the second clock input for receiving a second clock signal for causing the x number of switching devices to switch between the first and second states, and for causing the y number of latch circuits to latch bits of print data from the data outputs of the y number of the bit registers, where x is less than or equal to n, and y is less than or equal to n.

18. A method for operating on print data related to an image to be printed by an ink jet print head, and for operating on test point data to determine whether faults exist in internal logic nodes of the ink jet print head, the method comprising:
  (a) receiving bits of the print data in serial format at a print data input of a shift register in the print head when the shift register is in a first state;
  (b) receiving bits of the test point data in parallel format at test point inputs of the shift register when the shift register is in a second state;
  (c) shifting the bits of the print data through the shift register when the shift register is in the first state;
  (d) shifting the bits of the test point data through the shift register when the shift register is in the second state;
  (e) outputting the bits of the print data from the shift register in parallel format when the shift register is in the first state;
  (f) outputting the bits of the test point data from the shift register in serial format when the shift register is in the second state; and
  (g) determining, based on the test point data outputted from the shift register, whether faults exist in internal logic nodes of the print head.

19. The method of claim 18 further comprising:
  (e) receiving a serial string of bits of the print data at a serial input of the shift register;
  (f) shifting the bits of the print data through the shift register;
  (g) latching the bits of the print data from parallel outputs of the shift register; and
  (h) operating the print head to print the image based on the print data latched from the shift register.

* * * * *